United States Patent [19]
Thackeray et al.

[11] Patent Number: 5,700,624
[45] Date of Patent: Dec. 23, 1997

[54] POSITIVE ACID CATALYZED RESISTS HAVING AN ALKALI SOLUBLE RESIN WITH ACID LABILE GROUPS AND INERT BLOCKING GROUPS

[75] Inventors: James W. Thackeray, Braintree; Roger F. Sinta, Woburn; Mark D. Denison, Cambridge; Sheri L. Ablaza, Brookline, all of Mass.

[73] Assignee: Shipley Company, L.L.C., Marlborough, Mass.

[21] Appl. No.: 438,180

[22] Filed: May 9, 1995

[51] Int. Cl.$^6$ .............. G03F 7/021; G03F 7/023; G03F 7/039; G03C 1/72

[52] U.S. Cl. .............. 430/270.1; 430/171; 430/176; 430/191; 430/192; 430/193; 430/909; 430/910

[58] Field of Search .............. 430/270.1, 192, 430/191, 193, 165, 176, 171, 909, 910

[56] References Cited

U.S. PATENT DOCUMENTS

| | | | |
|---|---|---|---|
| 4,564,575 | 1/1986 | Perreault et al. | 430/192 |
| 4,985,332 | 1/1991 | Anderson et al. | 430/176 |
| 5,128,232 | 7/1992 | Thackeray et al. | 430/192 |
| 5,258,257 | 11/1993 | Sinta et al. | 430/192 |
| 5,286,599 | 2/1994 | Babich et al. | 430/270.1 |
| 5,340,696 | 8/1994 | Thackeray et al. | 430/270.1 |
| 5,350,660 | 9/1994 | Urano et al. | 430/176 |
| 5,352,564 | 10/1994 | Takeda et al. | 430/270.1 |
| 5,362,600 | 11/1994 | Sinta et al. | 430/192 |
| 5,403,695 | 4/1995 | Hayase et al. | 430/270.1 |
| 5,514,520 | 5/1996 | Thackeray et al. | 430/270.14 |
| 5,523,370 | 6/1996 | Watanabe et al. | 430/270.1 |
| 5,527,662 | 6/1996 | Hashimoto et al. | 430/270.1 |
| 5,541,263 | 7/1996 | Thackeray et al. | 430/270.1 |
| 5,558,971 | 9/1996 | Urano et al. | 430/270.1 |

FOREIGN PATENT DOCUMENTS

| | | |
|---|---|---|
| 0 534 324 A1 | 3/1993 | European Pat. Off. |
| 0 608 983 A1 | 8/1994 | European Pat. Off. |
| 0 632 327 A1 | 1/1995 | European Pat. Off. |

*Primary Examiner*—John S. Chu
*Attorney, Agent, or Firm*—Robert L. Goldberg

[57] ABSTRACT

The invention comprises an acid hardened resist system consisting of a resin binder having acid labile blocking groups and inert blocking groups and a photoacid generator. The inclusion of inert blocking groups on the resin improves shelf life without deleteriously affecting photolithographic properties of the resist.

13 Claims, No Drawings

POSITIVE ACID CATALYZED RESISTS HAVING AN ALKALI SOLUBLE RESIN WITH ACID LABILE GROUPS AND INERT BLOCKING GROUPS

BACKGROUND OF THE INVENTION

1. Field of the Invention

This invention relates to the use of the novel polymers for the formulation of photoresists particularly suitable for deep U.V. exposure and having the capability of forming highly resolved features of submicron dimension.

2. Description of the Prior Art

Photoresists are photosensitive films used for transfer of images to a substrate. They form negative or positive images. After coating a photoresist on a substrate, the coating is exposed through a patterned photomask to a source of activating energy such as ultraviolet light to form a latent image in the photoresist coating. The photomask has areas opaque to activating radiation and other areas transparent to activating radiation. The pattern in the photomask of opaque and transparent areas defines a desired image that may be used to transfer the image to a substrate. A relief image is provided by development of the latent image patterned in the photoresist coating. The use of photoresists are generally described, for example, by Deforest, Photoresist Materials and Processes, McGraw Hill Book Company, New York (1975), and by Moreau, Semiconductor Lithography, Principles, Practices and Materials, Plenum Press, New York (1988).

Known photoresists can form features having resolution and size sufficient for many existing commercial applications. However for many other applications, the need exits for new photoresists that can provide highly resolved images of submicron dimension.

Highly useful photoresist compositions capable of fine line image resolution are disclosed in U.S. Pat. No. 5,128,232 to Thackeray et at. incorporated herein by reference. The patent discloses, inter alia, the use of a photoresist resin binder that comprises a copolymer of non-aromatic cyclic alcohol units and phenolic units. The disclosed photoresists are particularly suitable for exposure to deep U.V. (DUV) radiation. As is recognized by those in the art, DUV radiation refers to exposure of the photoresist to radiation having a wavelength in the range of about 350 nm or less, more typically in the range of about 300 nm or less.

A class of photoresists for which the copolymers of the non-aromatic cyclic alcohol and phenolic units are particularly suitable are the positive acting compositions that comprise a resin binder having an acid or base cleavable blocking group and a photobase or photoacid generator that generates base or acid respectively, upon exposure to activating radiation. It is know that some cationic photoinitiators have been used to induce selective photogenerated acid cleavage of certain blocking groups pendant from a photoresist binder, or cleavage of certain blocking groups that comprise a photoresist binder. See, for example, U.S. Pat. Nos. 4,968,581; 4,883,740; 4,810,613 and 4,491,628 and Canadian Patent Appln. No. 2,001,384, all of which are incorporated herein by reference for their teaching of the described binders and acid labile blocking groups, and for methods of making and using the same. Such cleavage is reported to create differential solubility characteristics in exposed and unexposed areas of the polymer. Upon selective cleavage of the blocking group through exposure of the photoresist, a polar functional group is said to be provided, for example, carboxyl, phenyl, or imide.

In U.S. Pat. No. 5,258,257, incorporated herein by reference, it is reported that high solubility differentials between exposed and unexposed regions of a coating layer of a photoresist composition are realized with only modest levels of substitution of acid labile blocking groups on a resin binder, for example, substitution of the labile groups for about 1% of the hydroxyl groups of the resin binder and preferably, 5 to 35 % of the hydroxyl groups on the binder are blocked with acid labile groups. The binder used in this patent is preferably the above described copolymer of cyclic alcohol units and a phenol. In this patent, it is reported that the high solubility differential between exposed and unexposed regions with relatively low levels of blocking group substitution is possible because the cyclic alcohol units of the binder are less polar relative to the phenolic groups, effectively limiting the solubility of unexposed regions in aqueous alkaline developers, but enabling high solubility of those regions in suitable organic developers. Thus, in accordance with the invention set forth in said patent, a radiation sensitive composition is provided where a comparatively smaller mass of blocking groups is liberated upon photoinduced cleavage, thereby avoiding problems of prior systems such as shrinkage of the photoresist layer as a consequence of reduction in the mass of the resin binder by cleavage of the acid.

In accordance with U.S. Pat. No. 5,362,600, incorporated herein by reference, it is reported that by employing suitable blocking groups, a phenol-containing polymer binder comprising a high concentration of cyclic alcohol units may be employed. It is stated that this is accomplished by the highly polar groups that can be grafted onto the binder by the sequential steps of blocking at least a portion of the binder's hydroxyl groups, followed by acid catalyzed deprotection of the blocking groups. For example, acid catalyzed deprotection of a t-butyl acetate acid labile groups provide the acid ether moiety (—OCH$_2$COOH). Such polar groups render exposed regions soluble in a polar developer thereby permitting increased concentrations of cyclic alcohol units in the polymer to 60 mole percent or greater of the total polymer without loss in the dissolution properties of the photoresist. This enables formulation of a photoresist having superior optical clarity properties.

An alternative to the method for forming positive tone photoresist images using acid labile blocking groups on a polymer involves the use of dissolution inhibitors having acid labile blocking groups. A dissolution inhibitor is a photoresist compatible component such as a phenol or bisphenol with pendant phenolic hydroxyl groups blocked with the acid labile group. In this embodiment, the acid labile group is substituted on the dissolution inhibitor rather than on the polymer. A sufficient amount of the dissolution inhibitor is used to insolubilize the otherwise alkali soluble phenolic component. Differential solubility is achieved in essentially the same manner as when the acid labile blocking group is substituted on the resin binder—namely, by exposure of a coating of the photoresist to activating radiation resulting in a photolysis reaction that releases acid which cleaves the acid labile blocking group on the dissolution inhibitor resulting in formation of an alkali soluble polar group that renders the photoresist soluble in light exposed areas of the photoresist coating.

It has been found that with substantial acid catalyzed deprotection of a photoresist coating, as a consequence of evolution of isobutylene during processing the photoresist coating, a dried film of the photoresist undergoes shrinkage during exposure and baking. This results in a lack of conformity between the transferred image and the desired image. In addition, it has been found that the photolithographic properties of a positive working photoresist using resins or dissolution inhibitors having phenolic hydroxyl groups blocked with acid labile groups undergo minor change during prolonged storage of the photoresist. It is believed that this may be due at least in part to instability of the acid labile groups and cleavage of a portion of these groups during storage and prior to use. Though the change in photolithographic properties during storage may be minor, because of the exacting specifications for such resists, even minor changes are undesirable for the fabrication of many electronic devices.

SUMMARY OF THE INVENTION

The subject invention relates to a positive acting photoresist composition comprising an acid generator and an alkali soluble resin having a portion of its phenolic hydroxyl groups blocked with an acid labile blocking group or an alkali soluble resin in combination with a dissolution inhibitor having at least a portion of its phenolic hydroxyl groups blocked with an acid labile group. In accordance with the invention, it has been found that the total number of acid labile groups required for adequate resolution may be reduced if inert blocking groups are substituted on the alkali soluble resin of the photoresist utilizes an alkali soluble resin having acid labile groups substituted on the resin, then in that embodiment of the invention, the inert blocking groups are used in place of a portion of the acid labile groups. Unexpectedly, it has been found that a reduction in the number of acid labile blocking groups in the photoresist composition as a consequence of the use of inert blocking groups as described herein does not deleteriously effect the differential solubility properties of an exposed photoresist composition.

Based upon the above, the invention described herein comprises a positive working photoresist composition comprising a photoacid generator and an alkali soluble resin having ring substituted hydroxyl groups where a portion of the hydroxyl groups are blocked with an inert blocking group. In one embodiment of the invention, other of the hydroxyl groups on the alkali soluble resin are blocked with acid labile blocking groups. In a second embodiment of the invention, the resin having the inert blocking groups is used in combination with a dissolution inhibitor having acid labile blocking groups. Differential solubility in a coating of the photoresist is achieved by cleavage of acid labile groups resulting from photogenerated acid. In a further embodiment of the invention, both the resin and a dissolution inhibitor are provided with inert blocking groups.

The term "inert" as used in connection with the blocking groups is defined as chemically unreactive in the presence of acid generated during exposure and baking of the photoresist composition.

DESCRIPTION OF THE PREFERRED EMBODIMENTS

The polymer binder of the invention may be a conventional alkali soluble resin typically used in positive acting photoresists such as a novolak resin or a polyvinylphenol resin. Preferably, the resin is a copolymer of phenolic and cyclic alcohol units. The most preferred polymers for purposes of this invention are those formed by the hydrogenation of a phenol formaldehyde (novolak) or a poly (vinylphenol) resin.

Procedures for the preparation of conventional novolak and poly(vinylphenol) resins used as photoresist binders are well known in the art and disclosed in numerous publications including those discussed above. Novolak resins are the thermoplastic condensation products of a phenol and an aldehyde. Examples of suitable phenols for condensation with an aldehyde, especially formaldehyde, for the formation of novolak resins include phenol; m-cresol; o-cresol; p-cresol; 2,4-xylenol; 2,5-xylenol; 3,4-xylenol; 3,5-xylenol and thymol. An acid catalyzed condensation reaction results in the formation of a suitable novolak resin which may vary in molecular weight from about 500 to 100,000 daltons. The preferred novolak resins conventionally used for the formation of photoresists are the cresol formaldehyde condensation products.

Poly(vinylphenol) resins are thermoplastic polymers that may be formed by block polymerization, emulsion polymerization or solution polymerization of the corresponding monomers in the presence of a cationic catalyst or free radical initiator. Vinylphenols useful for the production of poly(vinylphenol) resins may be prepared, for example, by hydrolysis of commercially available coumarin or substituted coumarins, followed by decarboxylation of the resulting hydroxy cinnamic acids. Useful vinylphenols may also be prepared by dehydration of the corresponding hydroxy alkyl phenols or by decarboxylation of hydroxy cinnamic acids resulting from the reaction of substituted or non-substituted hydroxybenzaldehydes with malonic acid. Preferred poly(vinylphenol) resins prepared from such vinylphenols have a molecular weight range of from abut 2,000 to about 100,000 daltons.

As noted above, preferred resins for purposes of this invention are copolymers of phenols and nonaromatic cyclic alcohols analogous in structure to the novolak resins or the poly(vinylphenol) resins. These copolymers may be formed in several ways. For example, in the conventional preparation of a poly(vinylphenol) resin, a cyclic alcohol may be added to the reaction mixture as a comonomer during the polymerization reaction which is thereafter carried out in normal manner. The cyclic alcohol is preferably aliphatic, but may contain one or two double bonds. The cyclic alcohol is preferably one closest in structure to the phenol. For example, if the resin is a poly(vinylphenol), the comonomer would be vinyl cyclohexanol.

The preferred method for formation of the polymer comprises partial hydrogenation of a preformed novolak resin or a preformed poly(vinylphenol) resin. Hydrogenation may be carried out using art recognized hydrogenation procedures, for example, by passing a solution of the phenolic resin over a reducing catalyst such as a platinum or palladium coated carbon substrate or preferably, over Raney nickel at elevated temperature and pressure. The specific conditions are dependent upon the polymer to be hydrogenated. More particularly, the polymer is dissolved in a suitable solvent such as ethyl alcohol or acetic acid and then the solution is contacted with a freely divided Raney nickel catalyst and allowed to react at a temperature of from about 100° to 300° C. at a pressure of from about 50 to 300 atmospheres or more. The freely divided nickel catalyst may be a nickel-on-silica, nickel-on-alumina, or nickel-on-carbon catalyst depending upon the resin to be hydrogenated. Hydrogenation is believed to reduce the double bounds in some of the phenolic units resulting in a random polymer of phenolic and cyclic alcohol units randomly interspersed in the polymer in percentages dependent upon the reaction conditions used.

A preferred polymer binder comprises units of a structure selected from the group consisting of:

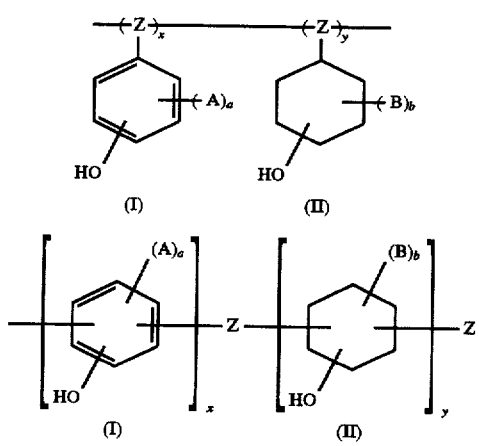

where each unit (I) represents a phenolic unit and unit (II) represents a cyclic alcohol unit; Z is an alkylene bridge having from 1 to 3 carbon atoms; A is a substituent on the aromatic ring replacing hydrogen such as lower alkyl having from 1 to 3 carbon atoms, halo such as chloro or bromo, alkoxy having from 1 to 3 carbon atoms, hydroxyl, nitro, amino, etc.; a is a number varying from 0 to 4; B is a substituent, such as hydrogen, lower alkyl having from 1 to 3 carbon atoms, halo such as chloro or bromo, alkoxy having from 1 to 3 carbon atoms, hydroxyl, nitro, amino, etc. provided that at least 3 of said B substituents are hydrogen; b is an integer varying between 6 and 10; x is the mole fraction of the units (I) in the polymer, y is the mole fraction of units (II) in the polymer and x+y equals 1.

To use the above binders in a photoresist composition, at least a portion of the available hydroxyl groups on the above polymer binder are bonded to suitable acid labile blocking groups. Suitable blocking groups in general are those that upon photocleavage provide a moiety that is more polar than hydroxyl. Further, the acid labile groups should generally be stable to any pre-exposure soft bake and should not substantially interfere with photoactivation of the composition.

In the above polymer, the percentage of cyclic alcohol units of the polymer preferably is not so high as to prevent development of an exposed film layer of the radiation sensitive composition in a polar developer solution. The polymer may have major portion of phenolic units and a minor portion of cyclic alcohol units, i.e., less than about 50 mole percent of cyclic alcohol units. However, as it has been found that transparency of the composition increases as the concentration of cyclic alcohol units in the polymer binder increases. Therefore, in certain instances, it may be desirable to employ a polymer having a major portion of cyclic alcohol units and a minor portion of phenolic units. This can be achieved by using blocking groups which upon acid catalyzed hydrolysis, provides polar functional groups rendering exposed regions more soluble in polar developer solutions. Thus, to provide a radiation sensitive composition having high transparency, the percentage of cyclic alcohol units of the subject polymer binder may be about 50 mole percent; to further enhance clarity of the composition, the percentage of cyclic alcohol groups may be about 60 mole percent; and to still further entrance the transparency of the composition, the percentage of cyclic alcohol groups may be about 70 percent or greater of the total polymer binder. Accordingly, x the mole fraction of units (I) in the polymer represented in the above formula may vary between about 0.30 and 0.99 and preferably varies between about 0.50 and 0.90; and y, the mole fraction of units (II) in the above polymer, may vary between 0.01 and 0.70 and preferably varies between about 0.10 and 0.30.

In that embodiment of the invention utilizing a resin having acid labile blocking groups, the acid labile blocking groups are generally employed by a condensation reaction with a compound that comprises an acid labile group to form polymers having the following general formulas:

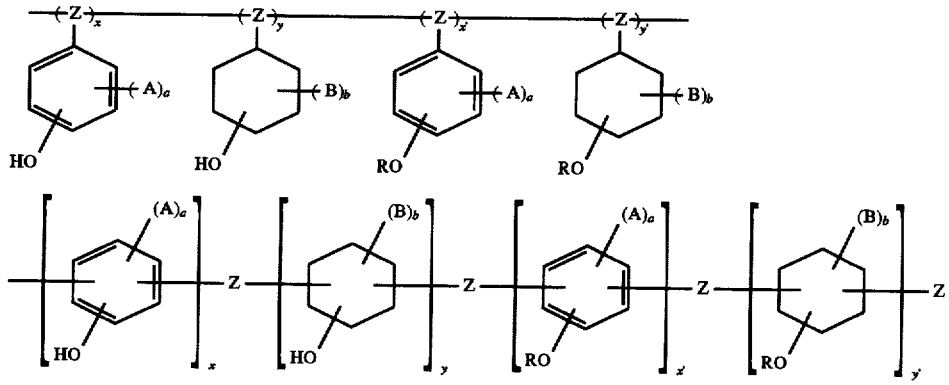

where A, a, B, b, Z and x and y are as defined above, x' and y' represent the mole fraction of the units having the acid labile group R, as defined below, and each varies between 0.01 and 0.5 and more preferably between 0.05 and 0.35. An alternative means for defining the above ranges is to state that preferably from about 1 to 50 % of the total pendant hydroxyl groups on the polymer are condensed with acid labile groups, and more preferably, from about 5 to 35 % of the total hydroxyl groups on the polymer are condensed with the acid labile blocking groups.

The acid labile group is typically formed on the polymer by an alkaline condensation reaction between the preformed polymer and a compound that comprises the acid labile group and a suitable leaving group, for example, a halogen such as bromide or chloride. For example, where R is a preferred t-butoxy carbonyl methyl group, t-butyl haloacetate (e.g., t-butyl chloroacetate) is added to a solution of the polymer and a suitable base, and the mixture stirred typically with heating. A variety of bases may be employed for this condensation reaction including hydroxides such as sodium hydroxide and alkoxides such as potassium t-butoxide. The condensation reaction is typically carried out in an organic solvent. A variety of organic solvents are suitable as should be apparent to those skilled in the art. Tetrahydrofuran, acetone and dimethylformamide are preferred solvents. Suitable conditions of the condensation reaction can be determined based upon the constituents used. For example, an admixture of sodium hydroxide, t-butylchloroacetate and a partially hydrogenated poly(vinylphenol) is stirred for about 15 to 20 hours at about 70° C.

The percent substitution on the polymer binder with the acid labile group can be controlled by the amount of the acid labile compound that is condensed with the binder. The preferred substitution of hydroxyl sites on the polymer binder can readily be ascertained by proton and 13C NMR.

Though constituting a lesser preferred embodiment of the invention, the polymer binder can be condensed with mixtures of two or more compounds to form acid labile groups to provide a mixture of acid labile groups bonded pendant to the polymer backbone. If the polymer is condensed with two or more acid labile groups, then groups R of the above formula will be a mixture of different groups. For example, if the subject polymer of phenolic groups and cyclic alcohol groups is first condensed with a compound of formula $R^x$ and then condensed with a compound of the formula $R^2$, where $R^1$ and $R^2$ of said formula are two different acid labile moieties and the polymer with comprise a mixture of $R^1$ and $R^2$ acid labile groups.

When a photoresist comprising a polymer having the acid labile groups and a photoacid generator are exposed to radiation of the appropriate wavelength, an acid is produced which cleaves the acid labile group to form a polar group enabling development of the photoresist in a suitable developer. Suitable photoacid generating compounds are described below and are generally well-known to those skilled in the art.

It has been found that the acid labile groups add predominantly to the more reactive phenolic groups rather than the cyclic alcohol groups of the above described polymer binders when a base such as sodium hydroxide is employed in the condensation reaction. That is, primarily only the phenolic groups of the binder are bonded to the above defined R groups and the cyclic alcohol groups are substantially free of acid labile groups. It is believed that acid labile groups will add to both the phenolic a cyclic alcohol groups of the binder by use of stronger bases such as butyl lithium or alkyl lithium reagents.

Suitable acid labile groups include acetate groups such as acetate groups of the formula —$C^1R^1R^2C$—(=O)—O—$R^3$, where $R^1$ and $R^2$ are each independently selected from the group of hydrogen, an electron withdrawing group such as halogen, lower alkyl having from 1 to about 10 carbon atoms, and substituted lower alkyl having from 1 to about 10 carbon atoms; and $R^3$ is substituted and unsubstituted lower alkyl having from 1 to about 10 carbon atoms, substituted and unsubstituted aryl having form 1 to about 10 carbon atoms, substituted or unsubstituted benzyl having 7 to about 13 carbon atoms. The substituents can be, for example, one or more halogen, lower alkyl, lower alkoxy, aryl or benzyl. $R^1$ and $R^2$ suitably are each hydrogen. It has been found that if $R^1$ and/or $R^2$ are halogen or other suitable electron-withdrawing group, upon acidic cleavage of the acetate group a highly polar moiety is provided along with enhanced solubility differentials between exposed and unexposed regions of a coating layer of the subject composition. The difluoro group (i.e., $R^1$ and $R^2$ both fluoro) is particularly suitable for such purposes and provides extremely high dissolution differentials between exposed and unexposed regions with only modest levels of substitution of hydroxy groups of the polymer binder. This difluoro group can be provided by alkaline condensation of the polymer with t-butyl chlorodifluoroacetate ($ClCF_2C(=O)OC(CH_3)_3$). As noted above, $R^3$ is preferably tert-butyl (i.e., R is the tert-butyl acetate group). Acid degradation of this group liberates isobutylene to provide the polar acetic acid ether moiety pendant to the polymer backbone.

It is understood that a wide range of acid labile groups are suitable, including many of the groups described in the patents incorporated herein by reference. For example, suitable acid labile groups include oxycarbonyl groups of the formula —C(=O)—O—$R^3$, where $R^3$ is the same as defined above. Preferably, $R^3$ is tert-butyl or benzyl (i.e., R is the t-butoxy carbonyl or benzyloxy carbonyl group).

In accordance with the invention, in addition to blocking a portion of the hydroxyl groups with an acid labile group, a fraction of the hydroxyl groups are also blocked with an inert blocking group whereby the resultant preferred polymer of the invention will have the following structures:

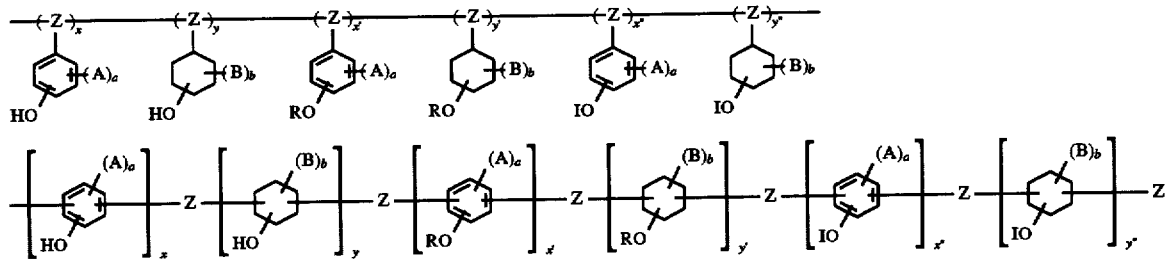

where A, a, B, b, Z, x, y, x+y equals 1, x' and y' are as defined above, x" and y" represent the mole fraction of inert blocking groups, and I represents the inert blocking group. Preferably, the total of the pendant hydroxyl groups blocked with the combination of the acid labile group and the inert blocking group is within the same limits set forth above for the blocked hydroxyl groups, that is the mole fraction of blocked hydroxyl groups on the binder varies from about 0.01 to 0.5 and more preferably, the mole fraction of blocked hydroxyl groups varies between about 0.05 and 0.35. In other words, the total of x'+y'+x"+y" does not exceed 0.5. The relative proportion of acid lab fie groups to inert blocking groups can be seen from the following table:

|  | Broad | Preferred |
|---|---|---|
| x' + y' | 0.00–0.45 | 0.05–0.30 |
| x" + y" | 0.05–0.25 | 0.05–0.10 |
| x' + y' + x" + y" | 0.10–0.50 | 0.15–0.35 |

With respect to the above table, x'+y' may be 0 when the system utilizes a separate dissolution inhibitor such as a blocked alcohol or the photoacid generator itself.

In a lesser preferred embodiment of the invention, the resin may be a conventional alkali soluble resin such as a novolak or poly(vinylphenol) phenol resin. In this embodiment of the invention, the resultant polymer would have a formula corresponding to one of the following structures:

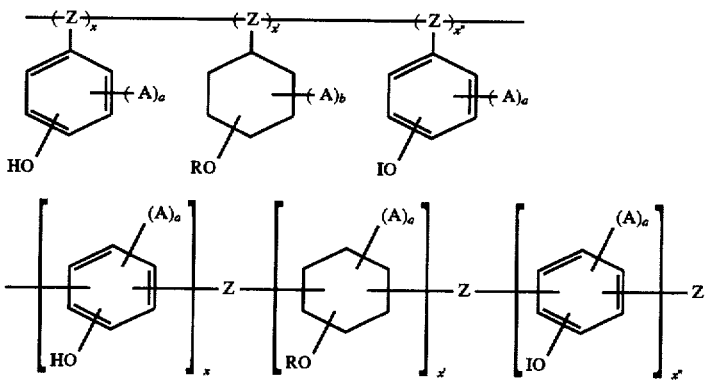

where A, a, x', x", Z, R and I are as defined above and the relative proportion of acid labile groups to inert blocking groups would be as defined in the table above where y' and y" are 0.

Any blocking group inert to generated acid at temperatures used to bake a photoresist and which does not interfere with the photolithographic reaction within the photoresist is suitable for purposes of the invention. Typical examples of suitable blocking groups include alkoxy groups such as methoxy, ethoxy, propoxy, n-butoxy, sec-butoxy, t-butoxy, etc.; alkyl esters represented by RCOO— where R is preferably an alkyl group having 1–4 carbon atoms such as methyl, ethyl, propyl, isopropyl, butyl, sec-butyl, t-butyl, etc.; sulfonyl acid esters such as methane sulfonyl, ethane sulfonyl, propane sulfonyl, benzene sulfonyl and toluenesulfonyl esters, etc.

In a lesser preferred embodiment of the invention, the condensation reaction used to substitute the acid labile blocking group onto the resin may also be used to substitute the inert blocking group onto the resin. Moreover, the inert blocking group may be substituted onto the resin simultaneously with the acid labile blocking group by providing a solution containing a mixture of reactants comprising the inert blocking group and the acid labile blocking group. The concentration of each substituted onto the resin may be controlled by the concentration of each in its reaction solution. However, it is desirable that the acid labile group and inert blocking group be substituted onto the resin sequentially rather than simultaneously with the inert blocking group substituted onto the resin first followed by the acid labile blocking group.

In an alternative embodiment of the invention, the polymer having the inert blocking groups are used in combination with a dissolution inhibitor having acid labile groups substituted thereon. In this embodiment of the invention, the dissolution inhibitor insolubilizes the resin. Upon exposure to activating radiation, the acid labile blocking groups are converted to polar groups by the photogenerated acid thus solubilizing the resin in alkali developer. The dissolution inhibitor used may be any of the alcohol backbones used for the formation of photoactive compounds known to the prior art. Such alcohols include, by way of example, hydroquinone, resorcinol, 2,4-dihydroxybenzophenone, 2,3,4-trihydroxybenzophenone, 2,4,6-trihydroxy benzophenone, 2,3,4,4'-tetrahydroxybenzophenone, 2,2,4,4'-tetrahydroxybenzophenone, 2,3,4,2,4'-pentahydroxybenzophenone, 2,3,4,2,6-pentahydroxybenzophenone, 2,3,4,3,4,5-hexahydroxybenzophenone, 2,4,6,3,4,5'-hexahydroxy-5-chlorobenzophenone, and 2,3,4,3,4,5'-hexahydroxy-5-benzoyl benzophenone, bis(3,4-dihydroxyphenyl) methane, 2,2-bis(2,4-dihydroxyphenyl) propane and 2,2-bis(2,3,4-trihydroxyphenyl) propane, bis(2,4-dihydroxyphenyl) methane, bis(2,3,4-trihydroxyphenyl)methane, 2,2-bis(2,4-dihydroxyphenyl)propane, 2,2-bis(2,3,4-trihydroxyphenyl)-propane, resorcinol, pyrogallol, glucinol, 2,4-dihydroxy phenolpropylketone, 2,4-dihy droxypheny 1-N-hexylketone, 2,3,4-trihydroxyphenyl-N-hexylketone, 3,4,5-trihydroxybenzoic ester, bis(2,4-dihydroxy benzoyl) methane, bis (2,3,4-trihydroxybenzoyl) methane, bis (2,4,6-trihydroxybenzoyl) methane, p-bis(2,5-dihydroxybenzoyl) benzene, p-bis(2,3,4-trihydroxybenzoyl) benzene and p-bis (2,4,6-trihydroxybenzoyl), ethyleneglycol di(3,5-dihydroxybenzoate), ethyleneglycol di(3,4,5-trihydroxybenzoate), 1,4-butanediol(3,4,5-trihydroxybenzoate) 1,8-octanediol, di (3 ,4,5-trihydroxybenzoate), polyethyleneglycol di (polyhydroxybenzoate), and triethyleneglycol di (3,4,5-trihydroxybenzoate).

The alcohol is converted to a dissolution inhibitor by reaction of the acid labile group with the hydroxyl group of the alcohol. The acid labile groups and reaction mechanisms described above are used to form the dissolution inhibitor. In this embodiment of the invention, the dissolution inhibitor is combined with the resin having the inert blocking group in an amount sufficient to insolubilize the resin. In general, the weight ratio of the resin to the dissolution inhibitor may vary between 2:1 to 10:1 and more preferably, between 3:1 and 6:1.

It should be understood that in a further embodiment of the invention, a photoresist can be formulated using a resin having both inert blocking groups and acid labile groups together with a dissolution inhibitor having the acid labile groups.

The polymer binders described above with or without the dissolution inhibitors are used in an acid catalyzed photoresist system comprising as additional ingredients, a photoacid generator and other components commonly found in such formulations such as sensitizers, anti-striation agents, etc. The photoacid generator may be chosen from a wide variety of compounds known to form an acid upon exposure to activating radiation. One preferred class of radiation sensitive compositions of this invention are compositions that use the copolymer of the phenol and cyclic alcohol substituted with acid labile groups as a binder and an o-quinone diazide sulfonic acid ester as a radiation sensitive component. The sensitizers most often used in such compositions are naphthoquinone diazide sulfonic acids such as those disclosed by Kosar, Light Sensitive Systems, John Wiley & Sons, 1965, pp. 343 to 352, incorporated herein by reference. These sensitizers form an acid in response to radiation of different wavelengths ranging from visible to X-ray. Thus, the sensitizer chosen will depend in part, upon the wavelengths used for exposure. By selecting the appropriate sensitizer, the photoresists can be imaged by deep UV, E-beam, laser or any other activating radiation conventionally used for imaging photoresists. Preferred sensitizers include the 2, 1,4-diazonaphthoquinone sulfonic acid esters and the 2,1,5-diazonaphthoquinone sulfonic acid esters.

Other useful acid generator include the family of nitrobenzyl esters, and the s-triazine derivatives. Suitable s-triazine acid generators are disclosed, for example, in U.S. Pat. No. 4,189,323, incorporated herein by reference.

Non-ionic photoacid generators are suitable including halogenated non-ionic, photoacid generating compounds such as, for example, 1,1-bis[p-chlorophenyl]-2,2,2-trichloroethane (DDT); 1,1-bis [p-methoxyphenyl]2,2,2-trichloroethane; 1,2,5,6,9,10-hexabromocyclododecane; 1,10-dibromodecane; 1,1-bis[p-chlorophenyl]-2,2-dichloroethane; 4,4-dichloro-2-(trichloromethyl) benzhydrol (Keltbane); hexachlorodimethyl sulfone; 2-chloro-6-(trichloromethyl) pyridine; 0,0-diethyl-O-(3,5,6-trichloro-2-pyridyl)phosphorothionate; 1,2,3,4,5,6-hexachlorocyclohexane; N(1,1-bis [p-chlorophenyl]-2,2,2-trichloroethyl)acetamide; tris[2,3-dibromopropyl] isocyanurate; 2,2-bis[p-chlorophenyl]-1,1-dichloroethylene; tris[trichloromethyl]s-triazine; and their isomers, analogs, homologs, and residual compounds. Suitable photoacid generators are also disclosed in European Patent Application Nos. 0164248 and 0232972, both referenced above.

Acid generators that are particularly preferred for deep U.V. exposure include 1,1-bis(p-chlorophenyl)-2,2,2-trichloroethane (DDT); 1,1-bis(p-methoxyphenol)-2,2,2-trichloroethane; 1,1—bis(chlorophenyl)-2,2,2 trichloroethanol; Iris(1,2,3-methanesulfonyl)benzene; and tris (trichloromethyl)triazine.

Onium salts are also suitable acid generators. Onium salts with weakly nucleophilic anions have been found to be particularly suitable. Examples of such anions are the halogen complex anions of divalent to heptavalent metals or non-metals, for example, Sb, Sn, Fe, Bi, Al, Ca, In, Ti, Zr, Sc, D, Cr, Hf, and Cu as well as B, P, and As. Examples of suitable onium salts are diaryl-diazonium salts and onium salts of group Va and B, Ia and B and I of the Periodic Table, for example, halopium salts, quaternary ammonium, phosphopium and arsonium salts, aromatic sulfonium salts and sulfoxonium salts or selenium salts. Examples of suitable preferred onium salts can be found in U.S. Pat. Nos. 4,442,197; 4,603,101; and 4,624,912, all incorporated herein by reference.

Another group of suitable acid generators is the family of sulfonated esters including sulfonyloxy ketones. Suitable sulfonated esters have been reporting in J. of Photopolymer Science and Technology, vol. 4, No. 3,337–340 (1991), incorporated herein by reference, including benzoin tosylate, t-butylphenyl alpha-(p-toluenesulfonyloxy)-acetate, and t-butyl alpha-(p-toluenesulfonyloxy)-acetate.

The compositions of the invention are generally prepared following prior art procedures for the preparation of photoresist compositions with the exception that the polymer binder with the blocking group as described herein is substituted at least in part for the conventional resins used in the formulation of such photoresists. The compositions of the invention are formulated as a coating composition by dissolving the components of the composition in a suitable solvent such as, for example, a glycol ether such as 2-methoxyethyl ether (diglyme), ethylene glycol monomethyl ether, ethylene glycol monomethyl ether, propylene glycol monomethyl ether; a Cellosolve ester such as methyl Cellosolve acetate; an aromatic hydrocarbon such as toluene or xylene; or a ketone such as methyl ethyl ketone. Typically, the solids content of the composition varies between about 5 and 35 percent by weight of the total weight of the radiation sensitive composition.

The compositions of the invention are used in accordance with generally known procedures though exposure and development conditions may vary as a consequence of improved photospeed and altered solubility in developer. The liquid coating compositions of the invention are applied to a substrate such as by spinning, dipping, roller coating or other conventional coating technique. When spin coating, the solids content of the coating solution can be adjusted to provide a desired film thickness based upon the specific spinning equipment utilized, the viscosity of the solution, the speed of the spinner and the amount of time allowed for spinning.

The composition is applied to a substrate conventionally used in processes involving coating with photoresists. For example, the composition may be applied over silicon or silicon dioxide wafers for the production of microprocessors and other integrated circuit components. Aluminum-aluminum oxide and silicon nitride wafers can also be coated with the photocurable compositions of the invention as a planarizing layer or for formation of multiple layers in accordance with art recognized procedures.

Following coating of the photoresist onto a surface, it is dried by heating to remove the solvent until preferably the photoresist coating is tack free. Thereafter, it is imaged through a mask in conventional manner. The exposure is sufficient to effectively activate the photoactive component of the photoresist system to produce a patterned image in the resist coating layer and, more specifically, the exposure energy typically ranges from about 10 to 300 mJ/cm$^2$, dependent upon the exposure tool and the components of the photoresist composition.

A wide range of activating radiation can be suitably employed to expose the photoacid or photo-base generating compositions of the invention, including radiation of wavelengths anywhere in the range of from about 240 to 700 nm. As noted above, the compositions of the invention are especially suitable for deep UV exposure. The spectral response of the compositions of invention can be expanded by the addition of suitable radiation sensitize compounds to the composition as would be apparent to those skilled in the art.

Following exposure, the film layer of the composition is preferably baked at temperatures ranging from about 70° C. to about 140° C. Thereafter, the film is developed. The exposed resist film is rendered positive working by employing a polar developer, preferably an aqueous based developer such as an inorganic alkali exemplified by sodium hydroxide, potassium hydroxide, sodium carbonate, sodium bicarbonate, sodium silicate, sodium metasilicate; quaternary ammonium hydroxide solutions such as a tetra-alkyl ammonium hydroxide solution; various amine solutions such as ethyl amine, n-propyl amine, diethyl amine, di-n-propyl amine, triethyl amine or, methyldiethyl amine; alcohol amines such as diethanol amine or triethanol amine; cyclic amines such as pyrrole, pyridine, etc. The developer strength can be higher using the modified resins in accordance with this invention compared to the resins used in the prior art in such compositions. Typically, developer strength can exceed 0.2N TMAH and typically can be as high as 0.3N TMAH with 0.26N TMAH being preferred.

Following development of the photoresist coating over the substrate, the developed substrate may be selectively processed on those areas bared of resist, for example by chemically etching or plating substrate areas bared of resist in accordance with procedures known in the art. For the manufacture of microelectronic substrates, for example, the manufacture of silicon dioxide wafers, suitable etchants include a plasma gas etch and a hydrofluoric acid etching solution. The compositions of the invention are highly resistant to such etchants thereby enabling manufacture of highly resolved features, including lines with submicron widths. After such processing, resist may be removed from the processed substrate using known stripping procedures.

The following examples are illustrative of the invention.

GENERAL COMMENTS

In the examples, the hydrogenated poly(vinylphenol) resin used was PHM-C grade obtained from Mamzen Oil of Tokyo, Japan. The degree of hydrogenation of these poly (p-vinylphenols) is expressed as a percentage of aromatic double bonds converted to single bonds, or equivalently as a percentage of hydroxyphenyl groups converted to hydroxycyclohexyl groups. All temperatures used throughout this disclosure are in degrees Celsius.

EXAMPLE 1

This example demonstrates that a positive tone resist image is obtained from the following photoresist and process free of acid labile blocking groups. In this system, the photoacid generator is also a functionally suitable dissolution inhibitor. The mesyl group on the polymer is the inert blocking group. Materials used to prepare the photoresist for this example are set forth below in parts by weight:

| | |
|---|---|
| Ethyl lactate (solvent) | 83.97 |
| Poly(p-vinyl)phenol being 10% hydrogenated and 9% blocked with Mesyl groups | 15.38 |
| Trisaryl sulfonium triflate | 0.62 |
| Polymethylsiloxane* | 0.03 |

*Silwet L-7604 (Union Carbide Co.)

The photoresist was spin-coated onto bare silicon wafers (vapor-primed with HMDS) for 30 seconds, then softbaked at 90° C. for 60 seconds on a vacuum hotplate yielding a film of 0.54 micron thickness as determined by a Prometrix film thickness monitor. A GCA 0.35NA excimer laser stepper was used to expose the coated wafers in a grid pattern with a varying exposure dose. The wafers were then immediately developed by immersion in 0.21 Normal tetramethylammonium hydroxide with an added surfactant (Shipley® MF-702) for 35 seconds. A resulting positive tone image was formed with the film thickness being inversely proportional to the exposure dose. The dose allowing complete clearing of the resist film was found to be 80 mJ/cm². A film thickness loss of 10% was found in the unexposed areas. It is significant to note that no post exposure baking was necessary to achieve the positive tone image.

EXAMPLE 2

Example 1 was repeated except that the developer strength was increased to 0.26 Normal. The results obtained were similar to those in Example 1 except that the dose allowing complete clearing of the resist was found to be 50 mJ/cm². There was a film thickness loss in the unexposed areas of 25%.

| | |
|---|---|
| Ethyl Lactate (solvent) | 83.97 |
| Poly(p-vinyl)phenol being 10% hydrogenated and 9% blocked with Mesyl groups | 15.38 |
| Tris-aryl sulfonium triflate | 0.62 |
| Polymethylsiloxane* | 0.03 |

*Silwet L-7604 (Union Carbide Co.)

EXAMPLE 3

The addition of an acid labile ester to the formulation as a dissolution inhibitor improves the contrast and resolution of the photoresist while minimizing the unexposed in thickness loss. Materials used to prepare the photoresist for this example are set forth below, in parts by weight:

| | |
|---|---|
| Ethyl Lactate (solvent) | 83.14 |
| Poly(p-vinyl)phenol being 10% hydrogenated and 9% blocked with Mesyl groups | 14.68 |
| t-Butyl Acetate blocked trihydroxyphenyl-ethane | 0.74 |
| Tris-aryl sulfonium triflate | 0.59 |
| Propylene glycol monomethyl ether acetate | 0.82 |
| Polymethylsiloxane¹ | 0.03 |

*Silwet L-7604 (Union Carbide Co.)

The photoresist was spin-coated onto bare silicon wafers (vapor-primed with HMDS) for 30 seconds, then softbaked at 110° C. for 60 seconds on a vacuum hotplate yielding a film of 0.54 micron thickness as determined by a Prometrix film thickness monitor. A GCA 0.35 NA excimer laser stepper was used to expose the coated wafers to a masking array of line space pairs with varying dimensions down to 0.25 µm at various exposure doses. The wafers were then post exposure baked on a vacuum hotplate at 90° C. for 60 s and developed by immersion in 0.21 Normal tetramethylammonium hydroxide with an added surfactant (Shipley® MF-702) for 120 s. There was a resulting positive tone image. Optical microscopy revealed 0.42 µm line space pairs were resolved at an exposure does of 25 mJ/cm². There was a film thickness loss of 13 % in unexposed areas of the photoresist.

EXAMPLE 4

This example illustrates the use of a polymer containing both inert and acid labile blocking groups which improves contrast and resolution of a photoresist while minimizing unexposed film thickness loss.

A photoresist was prepared having the following composition, in parts by weight:

| | |
|---|---|
| Ethyl lactate (solvent) | 83.96 |
| Poly(p-vinyl)phenol being 10% hydrogenated and 5% blocked with Mesyl groups and 10% blocked with t-butylacetate groups. | 15.42 |
| Tris-aryl sulfonium triflate | 0.59 |
| Polymethyl siloxane* | 0.03 |

*Silwet L-7604 (Union Carbide Co.)

The photoresist was spin-coated onto bare silicon wafers (vapor-primed with HMDS) for 30 seconds, then softbaked at 100° C. for 60 seconds on a vacuum hotplate yielding a film of 0.80 micron thickness as determined by a Prometrix fill thickness monitor. A GCA 0.35 NA excimer laser stepper was used to expose the coated wafers to a masking array of line space pairs with varying dimensions down to 0.25 μm at various exposures. The wafers were then post exposure baked on a vacuum hot plate at 90° C. for 60 seconds and developed by immersion in 0.26 Normal tetramethylammonium hydroxide with an added surfactant (Shipley® MF-702) for 120 seconds. There was a resulting positive tone image. Optical microscopy revealed that 0.36 μm line space pairs were resolved at an exposure does of 35 mJ/cm². There was a film thickness loss of 5 % in the unexposed areas of the photoresist.

We claim:

1. A positive acting photoresist composition comprising the combination of an alkali soluble novolak resin binder having pendant phenolic hydroxyl groups, pendant inert blocking groups and pendant acid labile groups and a photoacid generator that generates an acid upon exposure to activating radiation, said resin binder having been formed by reacting a minor portion of its pendant hydroxyl groups to form sulfonic acid ester groups inert to photogenerated acid and an additional minor portion of its pendant hydroxyl groups to form acid labile groups that cleave upon exposure to photogenerated acid, said photoacid generator being present in an amount whereby sufficient acid is generated upon exposure to activating radiation of sufficient strength to cleave the pendant acid labile groups causing said resin binder to become soluble in aqueous alkali solution.

2. The photoresist composition of claim 1 where the resin binder has the structure:

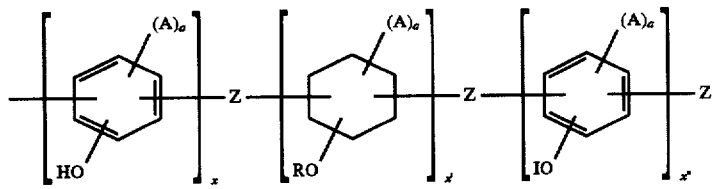

where Z is an alkylene bridge having from 1 m 3 carbon atoms; A is a substituent on the aromatic ring replacing hydrogen selected from the group consisting essentially of alkyl having from 1 to 3 carbon atoms, halo, alkoxy having from 1 m 3 carbon atoms, hydroxyl, nitro, and amino; a is a number yawing from 0 to 4; —OR is an acid labile group;

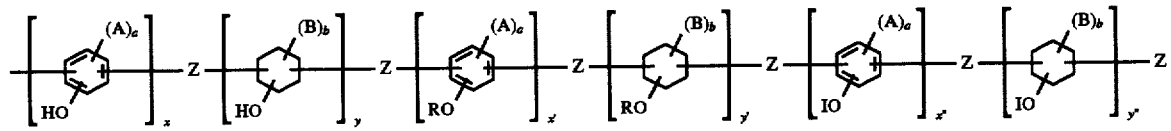

OI is an inert sulfonic acid ester blocking group, x is the mole fraction of the units having hydroxyl substitution, x' is the mole fraction of units having acid labile group substitution and x" is the mole fraction of units having inert blocking group substitution, each of x, x' and x" being greater than 0.01 and the total of x'+x+x" equaling 1.

3. The photoresist composition of claim 1 where the inert blocking group is a member selected from the group consisting of alkyl ester sulfonic acid ester groups having from 1 to 4 carbon atoms.

4. The photoresist composition of claim 1 containing as an additional component a dissolution inhibitor substituted with acid labile groups that cleave upon contact with photogenerated acid.

5. The photoresist composition of claim 4 where said dissolution inhibitor is aromatic and has pendant hydroxyl groups reacted to form groups inert to photogenerated acid.

6. The photoresist composition of claim 1 where the resin is a copolymer comprising phenolic units and cyclic alcohol units.

7. A positive acting photoresist composition comprising the combination of an alkali soluble novolak resin binder having phenolic groups and cyclic alcohol groups, each having pendant phenolic hydroxyl groups, pendant inert blocking groups and pendant acid labile groups; and a photoacid generator that generates an acid upon exposure to activating radiation, said resin binder having been formed by reacting a minor portion of its pendant hydroxyl groups to form acid ester groups inert to photogenerated acid and an additional minor portion of its pendant hydroxyl groups to form acid labile groups that cleave upon exposure to photogenerated acid, said photoacid generator being present in an amount whereby sufficient acid is generated upon exposure to activating radiation of sufficient strength to cleave said pendant acid labile groups causing said resin binder becomes soluble in aqueous alkali solution.

8. The photoresist composition of claim 7 where the resin binder has the structure:

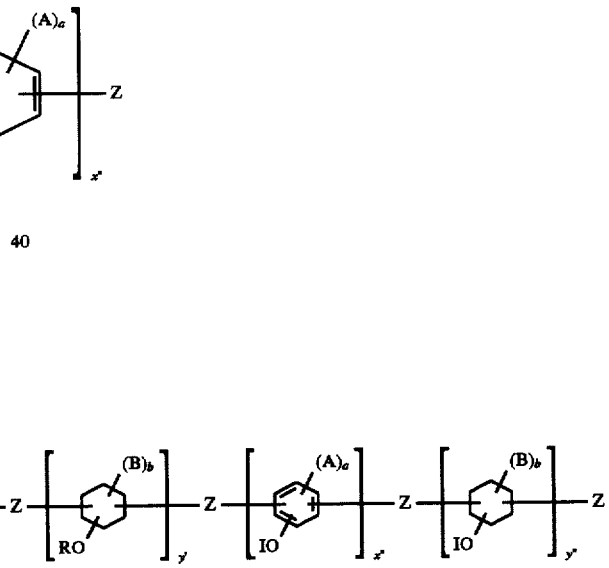

where Z is an alkylene bridge having from 1 to 3 carbon atoms; A is a substituent on the aromatic ring replacing hydrogen selected from the group consisting essential of alkyl having from 1 to 3 carbon atoms, halo, alkoxy having from 1 to 3 carbon atoms, hydroxyl, vitro, and amino; a is a number varying from 0 to 4; B is a member selected from the group consisting essentially of hydrogen, alkyl having from 1 to 3 carbon atoms, halo, alkoxy having from 1 to 3 carbon atoms, hydroxyl, vitro, and amino; a is a number varying from 0 to 4; b is an integer varying between 6 and 10; —OR is an acid labile group; I is an inert acid ester blocking group, x is the mole fraction of the units having hydroxyl substitution, x' is the mole fraction of units having acid labile group substitution and x" is the mole fraction of units having inert blocking group substitution where each of x, x' and x" is greater than 0.01 and the total of x+x"+x" equals 1, y is the mole fraction of units having hydroxyl substitution, y' is the mole fraction of units having acid labile group substitution and y" is the mole fraction of units having inert blocking group substitution where each of y, y' and y" is greater than 0.01 and the total of x+x"+x" equals 1 and the total of y+y'+y" equals 1.

9. The photoresist composition of claim 8 where the inert blocking group is a sulfonic acid ester group having from 1 to 4 carbon atoms.

10. The photoresist composition of claim 7 containing as an addition component a dissolution inhibitor substituted with acid labile groups that cleave upon contact with photogenerated acid.

11. The photoresist composition of claim 10 where said dissolution inhibitor is aromatic and has pendant hydroxyl groups reacted to form groups inert to photogenerated acid.

12. The photoresist composition of claim 1 where x" varies between 0.01 and 0.5.

13. The photoresist composition of claim 11 where x" varies between 0.01 and 0.5.

* * * * *